(12) United States Patent
Fujii (10) Patent No.: US 9,374,908 B2
(45) Date of Patent: Jun. 21, 2016

(54) ELECTRONIC COMPONENT AND SELECTION METHOD

(75) Inventor: Yasuo Fujii, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 389 days.

(21) Appl. No.: 13/598,655

(22) Filed: Aug. 30, 2012

(65) Prior Publication Data

US 2013/0219711 A1    Aug. 29, 2013

(30) Foreign Application Priority Data

Sep. 1, 2011    (JP) ................................. 2011-190736

(51) Int. Cl.

| | |
|---|---|
| *H01G 4/005* | (2006.01) |
| *H01G 4/228* | (2006.01) |
| *H05K 3/32* | (2006.01) |
| *H01G 4/01* | (2006.01) |
| *H01G 4/30* | (2006.01) |
| *H05K 1/02* | (2006.01) |
| *H01G 4/012* | (2006.01) |

(Continued)

(52) U.S. Cl.
CPC .. *H05K 3/32* (2013.01); *H01G 4/01* (2013.01); *H01G 4/012* (2013.01); *H01G 4/2325* (2013.01); *H01G 4/30* (2013.01); *H05K 1/0295* (2013.01); *H05K 1/111* (2013.01); *H05K 3/3442* (2013.01); *H05K 2201/2045* (2013.01); *Y10T 29/4913* (2015.01)

(58) Field of Classification Search
CPC ......... H01G 4/01; H01G 4/30; H01G 4/2325; H01G 4/012; H05K 3/32; H05K 3/3442; H05K 1/0295; H05K 1/111

USPC ....................................... 361/303, 306.1, 311
See application file for complete search history.

(56) References Cited

U.S. PATENT DOCUMENTS 6,563,689 B2 *   5/2003   Yamamoto ................. 361/306.1
6,781,816 B2 *   8/2004   Togashi ..................... 361/306.3

(Continued)

FOREIGN PATENT DOCUMENTS

| JP | 2000-232030 A | 8/2000 |
|---|---|---|
| JP | 2001-185441 A | 7/2001 |

(Continued)

OTHER PUBLICATIONS

Official Communication issued in corresponding Japanese Patent Application No. 2011-190736, mailed on Jul. 23, 2013.

*Primary Examiner* — Eric Thomas
(74) *Attorney, Agent, or Firm* — Keating & Bennett, LLP (57) ABSTRACT

In an electronic component, a laminate is obtained by laminating a plurality of ceramic layers, and includes an upper surface and a bottom surface which are at ends of the laminate in the z-axis direction, end surfaces facing each other, and side surfaces facing each other. First capacitor conductors, second capacitor conductors, and the ceramic layers are laminated. One of the first capacitor conductors and one of the second capacitor conductors face each other via one of the ceramic layers. A first external electrode and a second external electrode are located on one of the end surfaces and one of the side surfaces, respectively, and are connected to the first capacitor conductors. A third external electrode and a fourth external electrode are located on the other one of the end surfaces and the other one of the side surfaces, respectively, and are connected to the second capacitor conductors.

16 Claims, 6 Drawing Sheets

(51) Int. Cl.
*H01G 4/232* (2006.01)
*H05K 1/11* (2006.01)
*H05K 3/34* (2006.01)

(56) References Cited

U.S. PATENT DOCUMENTS

| | | | |
|---|---|---|---|
| 7,369,395 B2* | 5/2008 | Togashi | H01G 4/232 361/303 |
| 7,495,884 B2* | 2/2009 | Togashi | 361/306.3 |
| 7,535,694 B2* | 5/2009 | Togashi | 361/306.1 |
| 7,697,262 B2* | 4/2010 | Ritter et al. | 361/306.1 |
| 8,064,187 B2* | 11/2011 | Yoshida et al. | 361/301.4 |
| 2002/0007908 A1 | 1/2002 | Mamada | |
| 2003/0161089 A1 | 8/2003 | Togashi | |
| 2000/0139757 | 6/2009 | Lee et al. | |
| 2011/0205684 A1* | 8/2011 | Yamamoto et al. | 361/305 |

FOREIGN PATENT DOCUMENTS

| | | |
|---|---|---|
| JP | 2003059758 A * | 2/2003 |
| JP | 2003-257784 A | 9/2003 |
| JP | 2004-193352 A | 7/2004 |
| KR | 10-0867503 B1 | 11/2008 |

* cited by examiner

ELECTRONIC COMPONENT AND SELECTION METHOD

BACKGROUND OF THE INVENTION

1. Field of the Invention

The present invention relates to electronic components and selection methods, and, more particularly, to an electronic component including a capacitor and a selection method.

2. Description of the Related Art

In an electronic component in which a dielectric layer and a capacitor conductor are laminated, when an alternating voltage is applied to the electronic component, the alternating voltage generates an electric-field-induced strain at the dielectric layer. The electric-field-induced strain vibrates a substrate on which the electronic component is mounted and generates a sound called an acoustic noise. Examples of an electronic component with which such a "squeal" is suppressed include the method of mounting a multilayer ceramic capacitor on a circuit board disclosed in Japanese Unexamined Patent Application Publication No. 2000-232030.

As disclosed in Japanese Unexamined Patent Application Publication No. 2000-232030, capacitors that meet the same specifications are disposed on the surface and undersurface of a circuit board. A vibration transmitted from one of the capacitors to the circuit board and a vibration transmitted from the other one of the capacitors to the circuit board cancel each other. As a result, an acoustic noise is suppressed.

However, since two capacitors have to be disposed on both surfaces of a circuit board as disclosed in Japanese Unexamined Patent Application Publication No. 2000-232030, the degree of circuit design freedom is limited.

SUMMARY OF THE INVENTION

Preferred embodiments of the present invention provide an electronic component and a selection method which are capable of providing a high degree of circuit design freedom and suppressing an acoustic noise.

An electronic component according to a preferred embodiment of the present invention includes a laminate that is a substantially rectangular parallelepiped, includes a plurality of laminated dielectric layers, and includes an upper surface and a bottom surface which are at both ends of the laminate in a lamination direction, a first end surface and a second end surface facing each other, and a first side surface and a second side surface facing each other, a first capacitor conductor and a second capacitor conductor that are laminated with the dielectric layer and face each other via the dielectric layer, a first external electrode and a second external electrode that are disposed on the first end surface and the first side surface, respectively, and are connected to the first capacitor conductor, and a third external electrode and a fourth external electrode that are disposed on the second end surface and the second side surface, respectively, and are connected to the second capacitor conductor. On the first end surface and the first side surface, no external electrode held at a potential different from a potential at which the first and second external electrodes are held is disposed between the first and second external electrodes. On the second end surface and the second side surface, no external electrode held at a potential different from a potential at which the third and fourth external electrodes are held is disposed between the third and fourth external electrodes.

A selection method according to another preferred embodiment of the present invention is a method of selecting external electrodes to be used for mounting of the above-described electronic component on a circuit board including first to fourth land electrodes corresponding to the first to fourth external electrodes from among the first to fourth external electrodes. The selection method includes connecting the first and third external electrodes to the first and third land electrodes, respectively, in a case where sound generated by vibration of the circuit board when the first and third external electrodes are connected to the first and third land electrodes, respectively is smaller than that generated by vibration of the circuit board when the second and fourth external electrodes are connected to the second and fourth land electrodes, respectively and connecting the second and fourth external electrodes to the second and fourth land electrodes, respectively in a case where sound generated by vibration of the circuit board when the second and fourth external electrodes are connected to the second and fourth land electrodes, respectively is smaller than that generated by vibration of the circuit board when the first and third external electrodes are connected to the first and third land electrodes, respectively.

According to various preferred embodiments of the present invention, it is possible to obtain a high degree of circuit design freedom and suppress an acoustic noise.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

An electronic component according to a preferred embodiment of the present invention and a selection method according to another preferred embodiment of the present invention will be described below with reference to the accompanying drawings.

Figure 1:
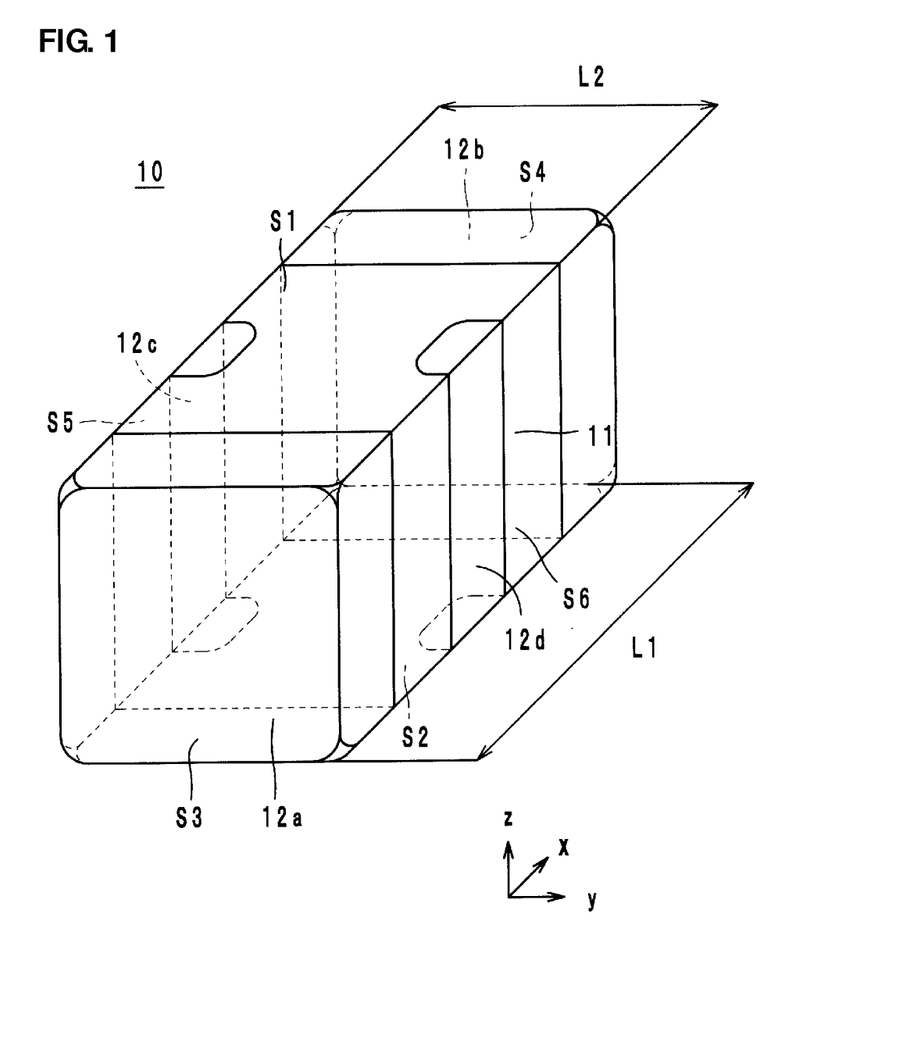
FIG. 1 is an external perspective view of an electronic component according to a preferred embodiment of the present invention.
Figure 2:
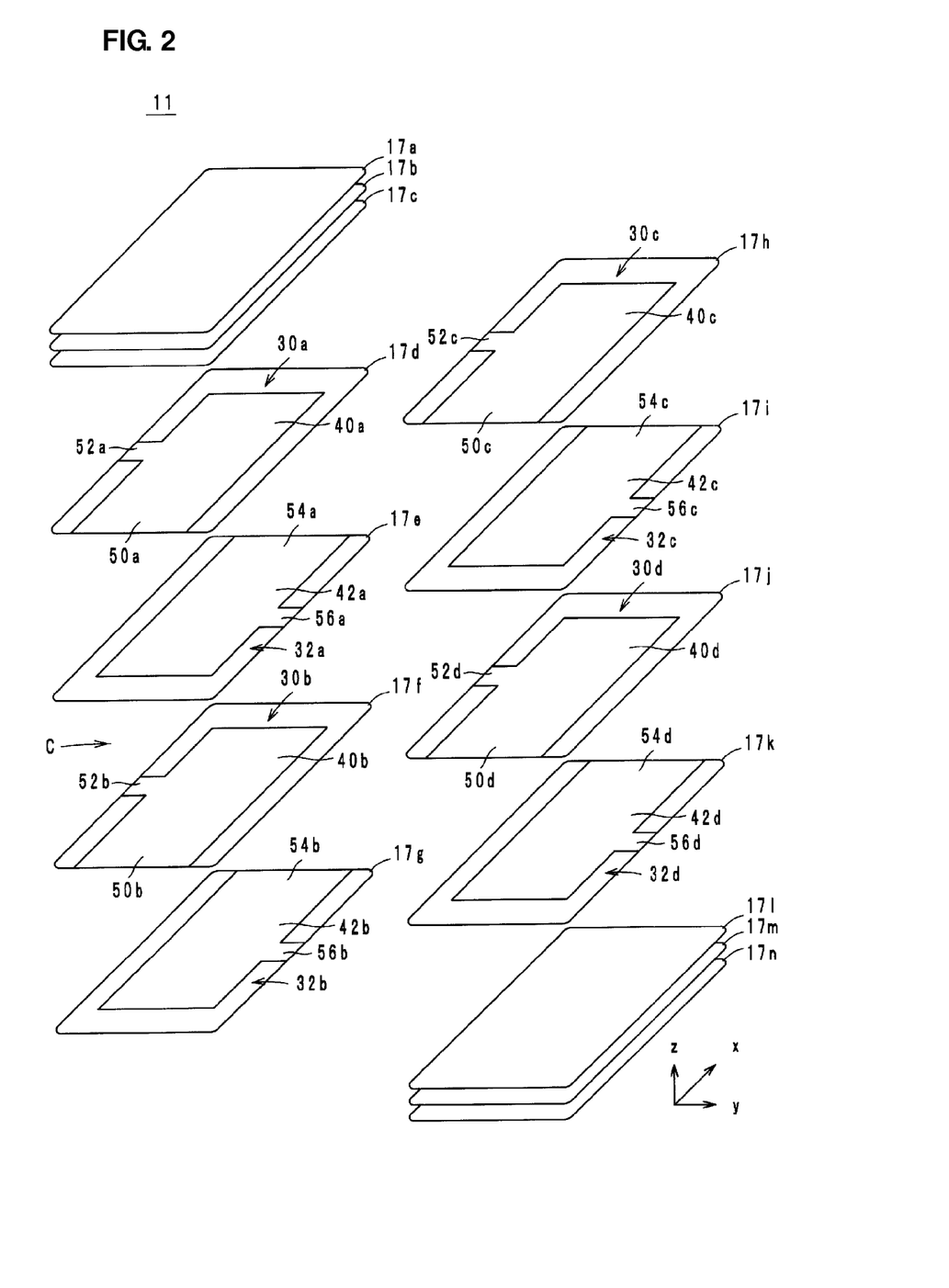
FIG. 2 is an exploded perspective view of a laminate in the electronic component illustrated in FIG. 1.

First, the structure of an electronic component according to a preferred embodiment of the present invention will be described with reference to the accompanying drawings. FIG. 1 is an external perspective view of an electronic component 10 according to a preferred embodiment of the present invention. FIG. 2 is an exploded perspective view of a laminate 11 in the electronic component 10 illustrated in FIG. 1. In the following description, a lamination direction in the laminate 11 is defined as a z-axis direction. A direction in which the long sides of the laminate 11 extend in plan view of the laminate 11 from the z-axis direction is defined as an x-axis direction. A direction in which the short sides of the laminate 11 extend in plan view of the laminate 11 from the z-axis direction is defined as a y-axis direction.

The electronic component 10 preferably is a chip capacitor, for example, and is mounted on a circuit board as illustrated in FIG. 1. As illustrated in FIGS. 1 and 2, the electronic component 10 includes the laminate 11, external electrodes 12 (12a to 12d), capacitor conductors 30 (30a to 30d) and 32 (32a to 32d) (not illustrated in FIG. 1).

As illustrated in FIG. 1, the laminate 11 is a substantially rectangular parallelepiped including an upper surface S1, a bottom surface S2, end surfaces S3 and S4 facing each other, and side surfaces S5 and S6 facing each other. The upper surface S1 and the bottom surface S2 are at both ends of the laminate 11 in the z-axis direction. Since chamfering is performed on the laminate 11, the laminate 11 has substantially round-shaped corners and ridge lines. In the following description, it is assumed that the upper surface S1 extends in the positive z-axis direction, the bottom surface S2 extends in the negative z-axis direction, the end surface S3 extends in the negative x-axis direction, the end surface S4 extends in the positive x-axis direction, the side surface S5 extends in the negative y-axis direction, and the side surface S6 extends in the positive y-axis direction in the laminate 11. The bottom surface S2 is a surface that faces a circuit board when the electronic component 10 is mounted on the circuit board.

The longitudinal direction of the laminate 11 is in the x-axis direction. A distance L1 between the end surfaces S3 and S4 and a distance L2 between the side surfaces S5 and S6 differ from each other. More specifically, the distance L1 is longer than the distance L2.

As illustrated in FIG. 2, the laminate 11 is obtained by laminating a plurality of ceramic layers (dielectric layers) 17 (17a to 17n) from the positive z-axis direction to the negative z-axis direction in this order. The ceramic layers 17 preferably are substantially rectangular in shape, and are made of a dielectric ceramic, for example. In the following description, the main surface of the ceramic layer 17 in the positive z-axis direction is called a surface and the main surface of the ceramic layer 17 in the negative z-axis direction is called an undersurface.

The upper surface S1 of the laminate 11 is the surface of the ceramic layer 17a extending in the most positive z-axis direction. The bottom surface S2 of the laminate 11 is the undersurface of the ceramic layer 17n extending in the most negative z-axis direction. The end surface S3 includes the short sides of the ceramic layers 17a to 17n in the negative x-axis direction. The end surface S4 includes the short sides of the ceramic layers 17a to 17n in the positive x-axis direction. The side surface S5 includes the long sides of the ceramic layers 17a to 17n in the negative y-axis direction. The side surface S6 includes the long sides of the ceramic layers 17a to 17n in the positive y-axis direction.

The capacitor conductors 30a to 30d and 32a to 32d and the ceramic layers 17 are laminated, so that the capacitor conductors 30a to 30d and the capacitor conductors 32a to 32d face, respectively via corresponding one of the ceramic layers 17. The capacitor conductors 30a to 30d and 32a to 32d define a capacitor C.

As illustrated in FIG. 2, the capacitor conductors 30a to 30d are disposed on the surfaces of the ceramic layers 17d, 17f, 17h, and 17j, respectively, and are included in the laminate 11. The capacitor conductors 30a to 30d include capacitor portions 40a to 40d, lead portions 50a to 50d, and lead portions 52a to 52d, respectively. The capacitor portions 40a to 40d preferably are substantially rectangular in shape. The lead portions 50a to 50d are connected to the capacitor portions 40a to 40d, respectively, and extend to the short sides of the ceramic layers 17d, 17f, 17h, and 17j in the negative x-axis direction, respectively. As a result, as illustrated in FIG. 1, the lead portions 50a to 50d extend to the end surface S3 (first end surface). The lead portions 52a to 52d are connected to the capacitor portions 40a to 40d, respectively, and extend to the long sides of the ceramic layers 17d, 17f, 17h, and 17j in the negative y-axis direction, respectively. As a result, as illustrated in FIG. 1, the lead portions 52a to 52d extend to the side surface S5 (first side surface).

As illustrated in FIG. 2, the capacitor conductors 32a to 32d are disposed on the surfaces of the ceramic layers 17e, 17g, 17i, and 17k, respectively, and are included in the laminate 11. The capacitor conductors 32a to 32d include capacitor portions 42a to 42d, lead portions 54a to 54d, and lead portions 56a to 56d, respectively. The capacitor portions 42a to 42d preferably are substantially rectangular in shape, and face the capacitor portions 40a to 40d via the ceramic layers 17d, 17f, 17h, and 17j, respectively. The lead portions 54a to 54d are connected to the capacitor portions 42a to 42d, respectively, and extend to the short sides of the ceramic layers 17e, 17g, 17i, and 17k in the positive x-axis direction, respectively. As a result, as illustrated in FIG. 1, the lead portions 54a to 54d extend to the end surface S4 (second end surface). The lead portions 56a to 56d are connected to the capacitor portions 42a to 42d, respectively, and extend to the long sides of the ceramic layers 17e, 17g, 17i, and 17k in the positive y-axis direction, respectively. As a result, as illustrated in FIG. 1, the lead portions 56a to 56d extend to the side surface S6 (second side surface).

The external electrode 12a (first external electrode) is disposed on the end surface S3, and is folded back on the upper surface S1, the bottom surface S2, and the side surfaces S5 and S6. The external electrode 12a entirely covers the end surface S3 of the laminate 11 so that it covers the portions of the lead portions 50a to 50d exposed on the end surface S3. As a result, the external electrode 12a is connected to the capacitor conductors 30a to 30d.

The external electrode 12b (third external electrode) is disposed on the end surface S4, and is folded back on the upper surface S1, the bottom surface S2, and the side surfaces S5 and S6. The external electrode 12b entirely covers the end surface S4 of the laminate 11 so that it covers the portions of the lead portions 54a to 54d exposed on the end surface S4. As a result, the external electrode 12b is connected to the capacitor conductors 32a to 32d.

The external electrode 12c (second external electrode) is disposed on the side surface S5, and is folded back on the upper surface S1 and the bottom surface S2. The external electrode 12c covers the portions of the lead portions 52a to 52d exposed on the side surface S5. As a result, the external electrode 12c is connected to the capacitor conductors 30a to 30d.

The external electrode 12d (fourth external electrode) is disposed on the side surface S6, and is folded back on the upper surface S1 and the bottom surface S2. The external electrode 12d covers the portions of the lead portions 56a to 56d exposed on the side surface S6. As a result, the external electrode 12d is connected to the capacitor conductors 32a to 32d.

The external electrodes 12a and 12c are held at the same potential, and the external electrodes 12b and 12d are held at the same potential. On the end surface S3 and the side surface S5, no external electrode that is held at a potential different from the potential of the external electrodes 12a and 12c is disposed between the external electrodes 12a and 12c. On the end surface S4 and the side surface S6, no external electrode that is held at a potential different from the potential of the external electrodes 12b and 12d is disposed between the external electrodes 12b and 12d. In the present preferred embodiment, on the end surfaces S3 and S4 and the side surfaces S5 and S6, no external electrodes other than the external electrodes 12a to 12d are disposed.

Figure 3:
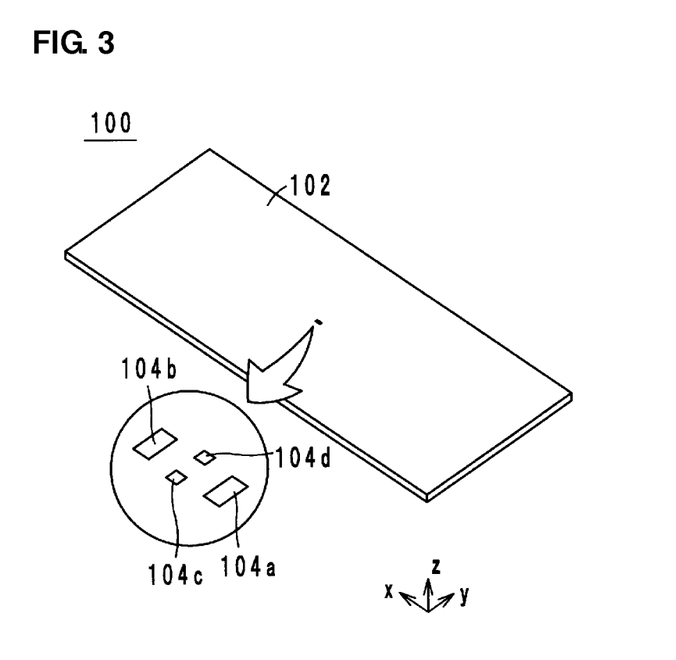
FIG. 3 is an external perspective view of a circuit board.

Next, the structure of a circuit board on which the electronic component 10 is mounted will be described with reference to the accompanying drawing. FIG. 3 is an external perspective view of a circuit board 100.

The circuit board 100 is a multilayer substrate including circuits thereon and therein, and is provided with a substrate body 102 and land electrodes 104 (104a to 104d) as illustrated in FIG. 3. The substrate body 102 is obtained by laminating a plurality of insulating layers, and preferably is substantially rectangular in shape. The long sides of the substrate body 102 are parallel or substantially parallel to the x-axis direction, and the short sides of the substrate body 102 are parallel to the y-axis direction.

The land electrodes 104a to 104d are disposed on the substrate body 102. More specifically, as illustrated in FIG. 3, the land electrodes 104a and 104b preferably are substantially rectangular in shape in plan view from the z-axis direction and are arranged in this order from the negative x-axis direction to the positive x-axis direction. As illustrated in FIG. 3, the land electrodes 104c and 104d preferably are substantially rectangular in shape in plan view from the z-axis direction and are arranged in this order from the negative y-axis direction to the positive y-axis direction. The land electrodes 104a to 104d are soldered to the external electrodes 12a to 12d, respectively. As will be described later, all of the external electrodes 12a to 12d are not connected to the land electrodes 104a to 104d, respectively. External electrodes to be used are selected from among the external electrodes 12a to 12d, and the selected external electrodes are individually connected to corresponding ones of the land electrodes 104a to 104d.

Figure 4A:
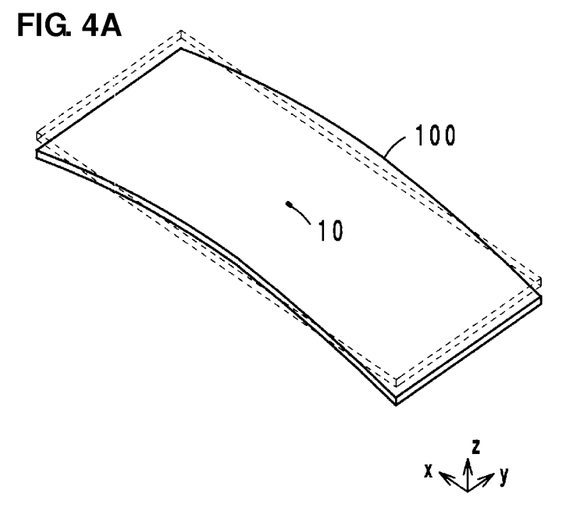
FIG. 4A is a diagram illustrating a state in which the circuit board resonates in a first resonant mode.
Figure 4B:
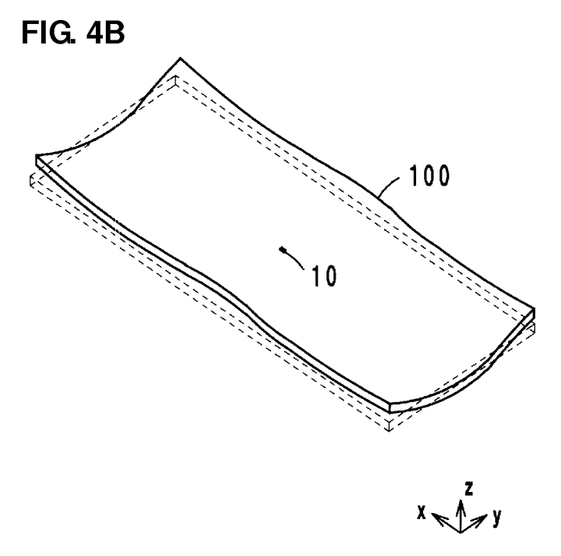
FIG. 4B is a diagram illustrating a state in which the circuit board resonates in a second resonant mode.

The circuit board 100 has a plurality of resonant modes. FIG. 4A is a diagram illustrating a state in which the circuit board 100 resonates in a first resonant mode. FIG. 4B is a diagram illustrating a state in which the circuit board 100 resonates in a second resonant mode.

Before the first and second resonant modes are described, the detailed structure of the circuit board 100 will be described. The circuit board 100 preferably has a size of approximately 100 mm×40 mm×1.6 mm, for example. The Young's modulus of the circuit board 100 preferably is approximately 17 GPa, and the Poisson's ratio of the circuit board 100 is approximately 0.2, for example.

As illustrated in FIG. 4A, the first resonant mode is a mode in which the circuit board 100 resonates while bending the long sides thereof extending in the x-axis direction. In the first resonant mode, both ends of the circuit board 100 in the x-axis direction become nodes of vibration and the center of the circuit board 100 in the x-axis direction becomes an antinode of vibration. The length of the circuit board 100 in the x-axis direction is equivalent to the half-wavelength of a wave propagating through the circuit board 100. A resonant frequency in the first resonant mode preferably is approximately 500 Hz, for example. The first resonant mode is set when the external electrodes 12a and 12b are soldered to the land electrodes 104a and 104b, respectively and an alternating voltage having a frequency close to approximately 500 Hz is applied to the electronic component 10.

As illustrated in FIG. 4B, the second resonant mode is a mode in which the circuit board 100 resonates while bending the short sides thereof extending in the y-axis direction. In the second resonant mode, both ends of the circuit board 100 in the y-axis direction become nodes of vibration and the center of the circuit board 100 in the y-axis direction becomes an antinode of vibration. The length of the circuit board 100 in the y-axis direction is equivalent to the half-wavelength of a wave propagating through the circuit board 100. A resonant frequency in the second resonant mode preferably is approximately 3.2 kHz, for example. The second resonant mode is set when the external electrodes 12c and 12d are soldered to the land electrodes 104c and 104d, respectively and an alternating voltage having a frequency close to approximately 3.2 kHz is applied to the electronic component 10.

Figure 5A:
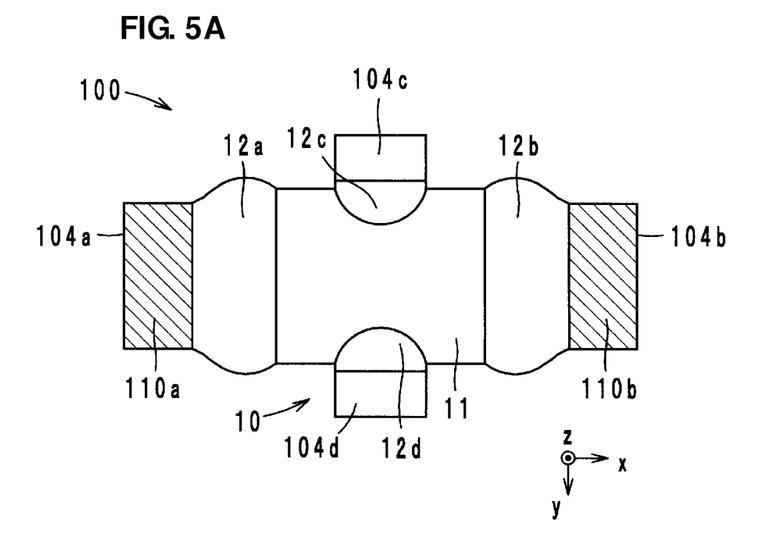
FIGS. 5A and 5B are plan views illustrating exemplary states in which the electronic component is mounted on the circuit board.
Figure 5B:
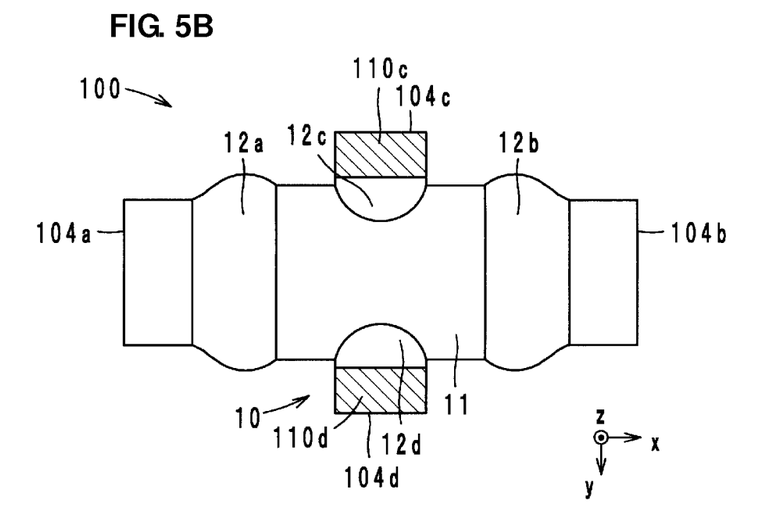

When the first or second resonant mode is set, an acoustic noise occurs. In the electronic component 10 and a selection method according to a preferred embodiment of the present invention, in order to suppress an acoustic noise, external electrodes to be used for the mounting of the electronic component 10 on the circuit board 100 are selected from among the external electrodes 12a to 12d. FIGS. 5A and 5B are plan views illustrating exemplary states in which the electronic component 10 is mounted on the circuit board 100. Referring to FIG. 5A, the external electrodes 12a and 12b are connected to the land electrodes 104a and 104b, respectively. Referring to FIG. 5B, the external electrodes 12c and 12d are connected to the land electrodes 104c and 104d, respectively.

In a case where sound (an acoustic noise) generated by the vibration of the circuit board 100 when the external electrodes 12a and 12b are connected to the land electrodes 104a and 104b, respectively is smaller than that generated by the vibration of the circuit board 100 when the external electrodes 12c and 12d are connected to the land electrodes 104c and 104d, respectively, the external electrodes 12a and 12b are connected to the land electrodes 104a and 104b, respectively. On the other hand, in a case where sound (an acoustic noise) generated by the vibration of the circuit board 100 when the external electrodes 12c and 12d are connected to the land electrodes 104c and 104d, respectively, is smaller than that generated by the vibration of the circuit board 100 when the external electrodes 12a and 12b are connected to the land electrodes 104a and 104b, respectively, the external electrodes 12c and 12d are connected to the land electrodes 104c and 104d, respectively.

For example, the absolute value of a difference between a frequency f1 of an alternating voltage applied to the electronic component 10 and the resonant frequency (that is, the resonant frequency in the first resonant mode: approximately 500 Hz) of the circuit board 100 in the x-axis direction in which the land electrodes 104a and 104b are arranged is larger than that of a difference between the frequency f1 of the alternating voltage and the resonant frequency (that is, the resonant frequency in the second resonant mode: approximately 3.2 kHz) of the circuit board 100 in the y-axis direction in which the land electrodes 104c and 104d are arranged, the external electrodes 12a and 12b are connected to the land electrodes 104a and 104b via solder portions 110a and 110b, respectively as illustrated in FIG. 5A. In this preferred embodiment, in a case where the frequency f1 of an alternating voltage is higher than approximately 1.85 kHz, the external electrodes 12a and 12b are connected to the land electrodes 104a and 104b via the solders 110a and 110b, respectively.

On the other hand, the absolute value of the difference between the frequency f1 of an alternating voltage and the resonant frequency in the first resonant mode is smaller than that of the difference between the frequency f1 of the alternating voltage and the resonant frequency in the second resonant mode, the external electrodes 12c and 12d are connected to the land electrodes 104c and 104d via solders 110c and 110d, respectively as illustrated in FIG. 5B. In the present preferred embodiment, in a case where the frequency f1 of an alternating voltage is lower than approximately 1.85 kHz, the external electrodes 12c and 12d are connected to the land electrodes 104c and 104d via the solders 110c and 110d, respectively.

Next, a non-limiting example of a method of manufacturing the electronic component 10 will be described with reference to FIGS. 1 and 2.

First, a binder and an organic solvent are added to ceramic powder such as $BaTiO_3$. These materials are input into a ball mill and are wet-mixed, so that ceramic slurry is obtained. The obtained ceramic slurry is formed on a carrier sheet in the form of a sheet by the doctor blade method and is then dried, so that a ceramic green sheet to be the ceramic layer 17 is created. It is desired that the thickness of a ceramic green sheet to be the ceramic layer 17 be in the range of approximately 0.5 μm to approximately 10 μm after firing. The ceramic powder may contain $CaTiO_3$, $SrTiO_3$, or $CaZrO_3$ as a main component, and may contain an Mn compound, an Mg compound, an Si compound, a Co compound, an Ni compound, or a rare-earth compound as an accessory component.

Subsequently, a paste made of a conductive material is applied to ceramic green sheets, which are to be the ceramic layers 17, by screen printing, so that the capacitor conductors 30 and 32 are formed. The paste made of the conductive material is obtained by adding an organic binder and an organic solvent to metal powder such as Ni, Cu, Ag, Pd, an Ag—Pd alloy, or Au. It is desired that the thicknesses of the capacitor conductors 30 and 32 be in the range of approximately 0.3 μm to approximately 2.0 μm after firing, for example.

Subsequently, the ceramic green sheets, which are to be the ceramic layers 17, are laminated to obtain a green mother laminate. The green mother laminate is compressed.

Subsequently, the green mother laminate is cut into a plurality of green laminates 11 each having a predetermined size. The surface of the green laminate 11 is subjected to polishing such as barrel polishing.

Subsequently, the green laminate 11 is fired. For example, the firing temperature is in the range of approximately 1200° C. to approximately 1300° C., for example.

Subsequently, the external electrodes 12 are formed at the laminate 11. More specifically, a conductive paste containing Cu, Ni, Ag, Pd, an Ag—Pd alloy, or Au is applied to the surface of the laminate 11 by a dip method or a slit method in the related art. A base electrode is formed by baking, and is subjected to Ni plating and Sn plating. As a result, the external electrodes 12 are formed. Through the above-described process, the electronic component 10 is formed.

The electronic component 10 having the above-described structure is mounted on the circuit board 100. The substrate body 102 of the circuit board 100 is obtained by laminating a plurality of insulating layers made of, for example, glass epoxy. The land electrode 104 is obtained by plating a base electrode made of Cu. First, external electrodes to be used for mounting are selected from among the external electrodes 12. Subsequently, a solder paste is applied to the land electrodes 104 corresponding to the selected external electrodes 12. Subsequently, the external electrodes 12 are arranged on the land electrodes 104 so that the bottom surface S2 faces the main surface of the substrate body 102 in the positive z-axis direction. Subsequently, the solder paste is melted by reflowing and is then hardened. As a result, the electronic component 10 is mounted on the circuit board 100.

For example, as the solder paste, Sn—Pb eutectic solder or lead-free solder such as Sn—Ag—Cu solder can be used. Instead of the solders 110, a conductive adhesive may be used.

With the electronic component 10 and the above-described selection method, an acoustic noise can be suppressed as will be described below. More specifically, at the circuit board 100 on which the electronic component 10 is mounted, the first resonant mode and the second resonant mode may occur. The first resonant mode is a mode in which the circuit board 100 resonates while bending the long sides thereof extending in the x-axis direction as illustrated in FIG. 4A. A resonant frequency in the first resonant mode is, for example, approximately 500 Hz. The second resonant mode is a mode in which the circuit board 100 resonates while bending the short sides thereof extending in the y-axis direction as illustrated in FIG. 4B. A resonant frequency in the second resonant mode is, for example, approximately 3.2 kHz.

In the electronic component 10, the external electrodes 12a and 12c are disposed on the end surface S3 and the side surface S5, respectively, and are connected to the capacitor conductors 30a to 30d. The external electrodes 12b and 12d are disposed on the end surface S4 and the side surface S6, respectively, and are connected to the capacitor conductors 32a to 32d. As external electrodes to be used for the mounting of the electronic component 10 on the circuit board 100, the external electrodes 12a and 12b or the external electrodes 12c and 12d can be selected. In a case where the absolute value of a difference between the frequency f1 of an alternating voltage applied to the electronic component 10 and the resonant frequency (approximately 500 Hz) in the first resonant mode is larger than that of a difference between the frequency f1 of the alternating voltage and the resonant frequency (approximately 3.2 kHz) in the second resonant mode, the external electrodes 12a and 12b are connected to the land electrodes 104a and 104b via the solders 110a and 110b, respectively as illustrated in FIG. 5A. As a result, when the alternating voltage is applied to the electronic component 10, the occurrence of the second resonant mode is suppressed. In a case where the absolute value of a difference between the frequency f1 of an alternating voltage and the resonant frequency in the first resonant mode is smaller than that of a difference between the frequency f1 of the alternating voltage and the resonant frequency in the second resonant mode, the external electrodes 12c and 12d are connected to the land electrodes 104c and 104d via the solders 110c and 110d, respectively as illustrated in FIG. 5B. As a result, when the alternating voltage is applied to the electronic component 10, the occurrence of the first resonant mode is suppressed. Thus, with the electronic component 10 and the selection method, the occurrence of the first resonant mode and the second resonant mode is suppressed and an acoustic noise is suppressed.

Furthermore, in the electronic component 10 and the selection method, two capacitors are not needed unlike in the method disclosed in Japanese Unexamined Patent Application Publication No. 2000-232030. Accordingly, a high degree of circuit design freedom can be obtained.

The electronic component 10 according to a preferred embodiment of the present invention and a selection method according to another preferred embodiment of the present invention can be changed within the scope of the present invention.

Figure 6A:
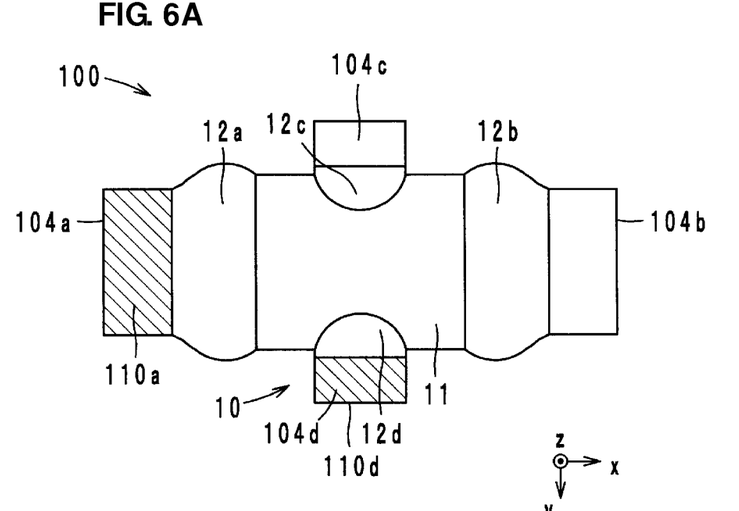
FIGS. 6A and 6B are plan views illustrating other exemplary states in which the electronic component is mounted on the circuit board.
Figure 6B:
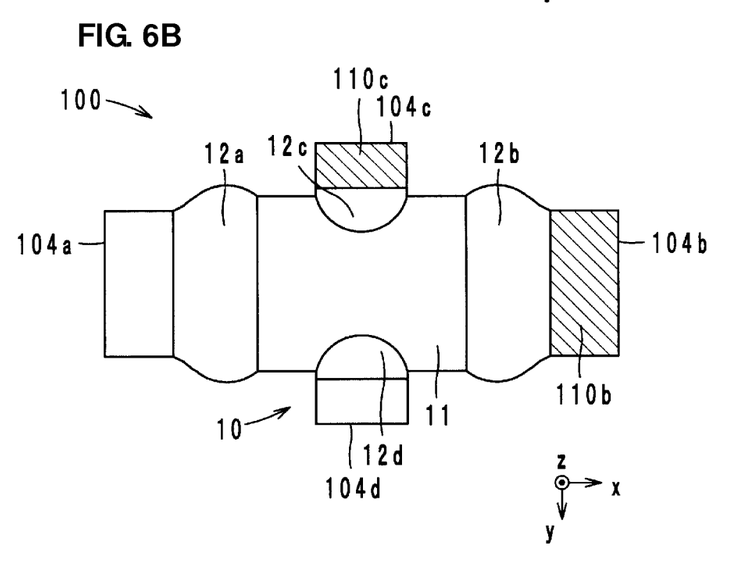

In the electronic component 10 and the above-described selection method, a connection pattern illustrated in FIG. 5A in which the external electrodes 12a and 12b are connected to the land electrodes 104a and 104b, respectively or a connection pattern illustrated in FIG. 5B in which the external electrodes 12c and 12d are connected to the land electrodes 104c and 104d, respectively is preferably selected. However, other connection patterns can be considered with the external electrodes 12a to 12d and the land electrodes 104a to 104d. FIGS. 6A and 6B are plan views illustrating other exemplary states in which the electronic component 10 is mounted on the circuit board 100.

Referring to FIG. 6A, the external electrodes 12a and 12d are connected to the land electrodes 104a and 104d, respectively. Referring to FIG. 6B, the external electrodes 12b and 12c are connected to the land electrodes 104b and 104c, respectively. In a case where the frequency f1 of an alternating voltage is close to both the resonant frequency in the first resonant mode and the resonant frequency in the second resonant mode, these connection patterns can be used.

The above-described selection method may be performed in the process of design of the electronic component and the circuit board 100. More specifically, in the process of design, external electrodes with which the occurrence of the first and second resonant modes is suppressed are selected from among the external electrodes 12a to 12d. At the time of manufacturing, only ones of the land electrodes 104a to 104d corresponding to the selected ones of the external electrodes 12a to 12d may be formed at the circuit board 100.

Various preferred embodiments of the present invention are useful for an electronic component and a selection method, and, in particular, has an advantage in its suitability for providing a high degree of circuit design freedom and suppressing an acoustic noise.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
a laminate including a plurality of laminated dielectric layers, an upper surface and a bottom surface which are at both ends of the laminate in a lamination direction, a first end surface and a second end surface facing each other, and a first side surface and a second side surface facing each other;
a first capacitor conductor and a second capacitor conductor that are laminated with the dielectric layers and face each other with one of the dielectric layers disposed therebetween;
a first external electrode and a second external electrode that are disposed on the first end surface and the first side surface, respectively, and are connected to the first capacitor conductor; and
a third external electrode and a fourth external electrode that are disposed on the second end surface and the second side surface, respectively, and are connected to the second capacitor conductor; wherein
a first distance between the first and the second end surfaces is greater than a second distance between the first and the second side surfaces;
the first capacitor conductor does not extend to the second side surface;
the second capacitor conductor does not extend to the first side surface;
on the first end surface and the first side surface, no external electrode held at a potential different from a potential at which the first and second external electrodes are held is disposed between the first and second external electrodes;

on the second end surface and the second side surface, no external electrode held at a potential different from a potential at which the third and fourth external electrodes are held is disposed between the third and fourth external electrodes;
the electronic component is configured such that when the electronic component is mounted on a circuit board, only one of the first external electrode or the second external electrode is directly connected to a respective land electrode of the circuit board and only one of the third external electrode or the fourth external electrode is directly connected to a respective land electrode of the circuit board; and
the first external electrode and the third external electrode are located on the laminate to be directly connected to the respective land electrode of the circuit board.

2. The electronic component according to claim 1, wherein
the first external electrode and the second external electrode are not electrically connected to each other on an outside of the laminate; and
the third external electrode and the fourth external electrode are not electrically connected to each other on the outside of the laminate.

3. The electronic component according to claim 1, wherein the bottom surface is a surface that faces the circuit board when any one of the first, second, third and fourth external electrodes are mounted on the circuit board.

4. The electronic component according to claim 1, wherein the first, second, third and fourth external electrodes include a base electrode, and a Ni plating and a Sn plating provided on the base electrode.

5. A mounting structure comprising:
an electronic component comprising:
a laminate including a plurality of laminated dielectric layers, an upper surface and a bottom surface which are at both ends of the laminate in a lamination direction, a first end surface and a second end surface facing each other, and a first side surface and a second side surface facing each other;
a first capacitor conductor and a second capacitor conductor that are laminated with the dielectric layers and face each other with one of the dielectric layers disposed therebetween;
a first external electrode and a second external electrode that are disposed on the first end surface and the first side surface, respectively, and are connected to the first capacitor conductor; and
a third external electrode and a fourth external electrode that are disposed on the second end surface and the second side surface, respectively, and are connected to the second capacitor conductor;
a circuit board comprising;
a substrate body; and
first to fourth land electrodes provided on a main surface of the substrate body and corresponding to the first to fourth external electrodes; wherein
a first distance between the first and the second end surfaces is greater than a second distance between the first and the second side surfaces;
the first capacitor conductor does not extend to the second side surface;
the second capacitor conductor does not extended to the first side surface;
on the first end surface and the first side surface, no external electrode held at a potential that is different from a potential at which the first and second external electrodes are held is disposed between the first and second external electrodes;

on the second end surface and the second side surface, no external electrode held at a potential that is different from a potential at which the third and fourth external electrodes are held is disposed between the third and fourth external electrodes;

the first external electrode is connected to the first land electrode;

the third external electrode is connected to the third land electrode;

the second external electrode is not connected to the second land electrode; and the fourth external electrode is not connected to the fourth land electrode.

6. The mounting structure according to claim 5, wherein
the first external electrode and the second external electrode are not electrically connected to each other on an outside of the laminate; and
the third external electrode and the fourth external electrode are not electrically connected to each other on the outside of the laminate.

7. The mounting structure according to claim 5, wherein the bottom surface is a surface that faces a circuit board when any one of the first, second, third and fourth external electrodes are mounted on the circuit board.

8. The mounting structure according to claim 5, wherein the first, second, third and fourth external electrodes include a base electrode, and a Ni plating and a Sn plating provided on the base electrode.

9. The mounting structure according to claim 5, wherein
the substrate body is rectangular or substantially rectangular in shape when viewed in plan in a direction perpendicular to the main surface of the substrate body;
the first land electrode and the third land electrode are arranged along a direction in which a long side of the substrate body extends when viewed in plan in the direction perpendicular to the main surface of the substrate body;
the second land electrode and the fourth land electrode are arranged along a direction in which a short side of the substrate body extends when viewed in plan in the direction perpendicular to the main surface of the substrate body.

10. The mounting structure according to claim 9, wherein the first to fourth land electrodes are provided at the center or approximate center of the substrate body when viewed in plan in the direction perpendicular to the main surface of the substrate body.

11. A mounting structure comprising:
an electronic component comprising;
a laminate including a plurality of laminated dielectric layers, an upper surface and a bottom surface which are at both ends of the laminate in a lamination direction, a first end surface and a second end surface facing each other, and a first side surface and a second side surface facing each other;
a first capacitor conductor and a second capacitor conductor that are laminated with the dielectric layers and face each other with one of the dielectric layers disposed therebetween;
a first external electrode and a second external electrode that are disposed on the first end surface and the first side surface, respectively, and are connected to the first capacitor conductor; and
a third external electrode and a fourth external electrode that are disposed on the second end surface and the second side surface, respectively, and are connected to the second capacitor conductor;
a circuit board comprising;
a substrate body; and
first to fourth land electrodes provided on a main surface of the substrate body and corresponding to the first to fourth external electrodes; wherein
a first distance between the first and the second end surfaces is greater than a second distance between the first and the second side surfaces;
the first capacitor conductor does not extend to the second side surface;
the second capacitor conductor does not extend to the first side surface;
on the first end surface and the first side surface, no external electrode held at a potential that is different from a potential at which the first and second external electrodes are held is disposed between the first and second external electrodes;
on the second end surface and the second side surface, no external electrode held at a potential that is different from a potential at which the third and fourth external electrodes are held is disposed between the third and fourth external electrodes;
the first external electrode is not connected to the first land electrode;
the third external electrode is not connected to the third land electrode;
the second external electrode is connected to the second land electrode; and
the fourth external electrode is connected to the fourth land electrode.

12. The mounting structure according to claim 11, wherein
the first external electrode and the second external electrode are not electrically connected to each other on an outside of the laminate; and
the third external electrode and the fourth external electrode are not electrically connected to each other on the outside of the laminate.

13. The mounting structure according to claim 11, wherein the bottom surface is a surface that faces a circuit board when any one of the first, second, third and fourth external electrodes are mounted on the circuit board.

14. The mounting structure according to claim 11, wherein the first, second, third and fourth external electrodes include a base electrode, and a Ni plating and a Sn plating provided on the base electrode.

15. The mounting structure according to claim 11, wherein
the substrate body is rectangular or substantially rectangular in shape when viewed in plan in a direction perpendicular to the main surface of the substrate body;
the first land electrode and the third land electrode are arranged along a direction in which a long side of the substrate body extends when viewed in plan in the direction perpendicular to the main surface of the substrate body;
the second land electrode and the fourth land electrode are arranged along a direction in which a short side of the substrate body is extended when viewed in plan in the direction perpendicular to the main surface of the substrate body.

16. The mounting structure according to claim 15, wherein the first to fourth land electrodes are provided at the center or approximate center of the substrate body when viewed in plan in the direction perpendicular to the main surface of the substrate body.

* * * * *